(12) United States Patent
Zhang et al.

(10) Patent No.: US 11,635,460 B2
(45) Date of Patent: Apr. 25, 2023

(54) MEMORY TEMPERATURE CONTROLLING METHOD AND MEMORY TEMPERATURE CONTROLLING SYSTEM

(71) Applicant: Hefei Core Storage Electronic Limited, Anhui (CN)

(72) Inventors: Biao Zhang, Anhui (CN); Weikang Wang, Anhui (CN); Hai Han, Liaoning (CN); Jun Liang, Anhui (CN); Ren Jun Tang, Anhui (CN)

(73) Assignee: Hefei Core Storage Electronic Limited, Anhui (CN)

( * ) Notice: Subject to any disclaimer, the term of this patent is extended or adjusted under 35 U.S.C. 154(b) by 18 days.

(21) Appl. No.: 17/485,515

(22) Filed: Sep. 27, 2021

(65) Prior Publication Data

US 2023/0074401 A1 Mar. 9, 2023

(30) Foreign Application Priority Data

Sep. 9, 2021 (CN) .......................... 202111057816.4

(51) Int. Cl.
*G01R 31/28* (2006.01)
*G01R 31/3181* (2006.01)
*G01R 31/317* (2006.01)

(52) U.S. Cl.
CPC ..... *G01R 31/2874* (2013.01); *G01R 31/2884* (2013.01); *G01R 31/31701* (2013.01); *G01R 31/31813* (2013.01)

(58) Field of Classification Search
CPC ............ G01R 31/2874; G01R 31/2884; G01R 31/31701; G01R 31/31813

(Continued)

(56) References Cited

U.S. PATENT DOCUMENTS

| 8,466,707 B2* | 6/2013 | Mohammad | ........... G11C 29/12 324/762.01 |
|---|---|---|---|
| 9,000,788 B2* | 4/2015 | Pagani | ............. G01R 31/31713 702/123 |
| 2016/0146897 A1* | 5/2016 | Teng | .................... G01R 31/387 324/428 |

FOREIGN PATENT DOCUMENTS

| CN | 103674314 | 3/2014 |
|---|---|---|
| TW | 387583 | 4/2000 |

(Continued)

OTHER PUBLICATIONS

"Office Action of Taiwan Counterpart Application", dated May 10, 2022, p. 1-p. 10.

*Primary Examiner* — Giovanni Astacio-Oquendo
(74) *Attorney, Agent, or Firm* — JCIPRNET

(57) ABSTRACT

A memory temperature controlling method and a memory temperature controlling system are provided. The method includes: performing, by a testing equipment, test modes on a memory storage device, and obtaining a first internal temperature of a memory control circuit unit, a second internal temperature of each memory package and a surface temperature of each memory package to establish a linear relationship expression of the first internal temperature, the second internal temperature and the surface temperature; using, by the memory storage device, the linear relationship expression to calculate a predicted surface temperature of a rewritable non-volatile memory based on a first current internal temperature of the memory control circuit unit and a second current internal temperature of each memory package; adjusting, by the memory storage device, an operating frequency for accessing the rewritable non-volatile memory based on the predicted surface temperature.

19 Claims, 4 Drawing Sheets

(58) Field of Classification Search
USPC .................. 324/750.03, 750.01, 537, 500
See application file for complete search history.

(56) References Cited

FOREIGN PATENT DOCUMENTS

| | | |
|---|---|---|
| TW | 201719643 | 6/2017 |
| TW | 201842428 | 12/2018 |
| TW | 202036545 | 10/2020 |
| TW | 202117607 | 5/2021 |

* cited by examiner

MEMORY TEMPERATURE CONTROLLING METHOD AND MEMORY TEMPERATURE CONTROLLING SYSTEM

CROSS-REFERENCE TO RELATED APPLICATION

This application claims the priority benefit of China application serial no. 202111057816.4, filed on Sep. 9, 2021. The entirety of the above-mentioned patent application is hereby incorporated by reference herein and made a part of this specification.

BACKGROUND

Technical Field

The disclosure relates to a memory temperature controlling technology, and particularly relates to a memory temperature controlling method and a memory temperature controlling system.

Description of Related Art

The rapid growth of digital cameras, mobile phones and MP3 in the past few years has led to a rapid increase in consumer demand for storage media. Because rewritable non-volatile memory is characterized in non-volatile data, power saving, small size, no mechanical structure, and fast reading and writing speed, it is most suitable for portable electronic products, such as notebook computer. A solid state drive is a memory storage device that uses a flash memory module as a storage medium. Therefore, the flash memory industry has become a very popular part of the electronics industry in recent years.

Generally speaking, a large amount of heat energy is generated when a memory storage device operates. With the development trend of rewritable non-volatile memory modules with larger capacity and faster speeds in small-size products, the risk of memory storage devices being overheated is increasing. In order to prevent the memory storage device from being damaged due to overheating, the temperature of the memory storage device must be kept below a certain temperature. In the conventional technology, a thermal sensor provided in the memory storage device is generally used to measure the surface temperature of the memory package closest to the memory controller, and the measured temperature is used to determine whether it is necessary to slower the speed. However, the memory controller does not only access the memory package closest to the memory controller, and the temperature of a single memory package does not stand for the temperature of all memory packages. It is not accurate to use only the temperature of a single memory package to determine whether a speed reduction is required. Therefore, how to design a memory storage device that takes into account the efficiency of temperature control and frequency modulation and saves the circuit layout space of the PCB substrate is a topic of concern to those skilled in the art.

SUMMARY

The disclosure provides a memory temperature controlling method and a memory temperature controlling system, which can save the circuit layout space of the PCB substrate while still using temperature control and frequency modulation to protect the memory storage device, thereby reducing costs of production.

An embodiment of the disclosure provides a memory temperature controlling method for a memory storage device. The memory storage device includes a memory control circuit unit and a rewritable non-volatile memory module. The rewritable non-volatile memory module includes a plurality of memory packages. The method includes: performing, by a testing equipment, a plurality of test modes on a memory storage device, and obtaining a first internal temperature of the memory control circuit unit, a second internal temperature of each of the memory packages and a surface temperature of each of the memory packages to establish a linear relationship expression of the first internal temperature, the second internal temperature and the surface temperature; storing, by the testing equipment, the linear relationship expression in the memory storage device; using, by the memory storage device, the linear relationship expression to calculate a predicted surface temperature of a rewritable non-volatile memory module based on a first current internal temperature of the memory control circuit unit and a second current internal temperature of each of the memory packages; and adjusting, by the memory storage device, an operating frequency for accessing the rewritable non-volatile memory module based on the predicted surface temperature.

In an embodiment of the disclosure, when performing the plurality of test modes, the testing equipment transmits at least one instruction to the memory storage device, and the memory storage device receives and executes the at least one instruction.

In an embodiment of the disclosure, the at least one instruction includes at least one of a write instruction and a read instruction.

In an embodiment of the disclosure, the multiple test modes include a test environment temperature. The method further includes: testing, by the testing equipment, the memory storage device at the test environment temperature.

In an embodiment of the disclosure, the step of performing, by the testing equipment, a plurality of test modes on the memory storage device includes: determining whether the surface temperature is greater than a first temperature threshold, and when the surface temperature is greater than the first temperature threshold, the operating frequency for accessing the rewritable non-volatile memory module is reduced.

In an embodiment of the disclosure, the method further includes: calculating, by the memory storage device, multiple predicted surface temperatures of the plurality of memory packages by using the linear relationship expression corresponding to each of the memory packages, and selecting a maximum value of the multiple predicted surface temperatures of the multiple memory packages as the predicted surface temperature of the rewritable non-volatile memory module.

In an embodiment of the disclosure, the step of adjusting, by the memory storage device, an operating frequency for accessing the rewritable non-volatile memory module based on the predicted surface temperature includes: determining whether to adjust the operating frequency for accessing the rewritable non-volatile memory module according to the preset temperature threshold.

In an embodiment of the disclosure, the step of determining whether to adjust the operating frequency for accessing the rewritable non-volatile memory module according to the preset temperature threshold includes: if it is determined that the predicted surface temperature is greater than the second temperature threshold, the operating frequency for accessing the rewritable non-volatile memory module is reduced by the memory storage device.

An embodiment of the disclosure provides a memory temperature controlling system, including a testing equipment and a memory storage device. The memory storage device includes a memory control circuit unit and a rewritable non-volatile memory module, and the rewritable non-volatile memory module includes a plurality of memory packages. The testing equipment performs a plurality of test modes on the memory storage device, and obtains the first internal temperature of the memory control circuit unit, the second internal temperature of each of the memory packages, and the surface temperature of each of the memory packages to establish a linear relationship expression of the first internal temperature, the second internal temperature and the surface temperature. The testing equipment stores the linear relationship expression in the memory storage device. The memory storage device uses the linear relationship expression to calculate the predicted surface temperature of the rewritable non-volatile memory module based on the first current internal temperature of the memory control circuit unit and the second current internal temperature of each of the memory packages. Moreover, the memory storage device adjusts the operating frequency for accessing the rewritable non-volatile memory module based on the predicted surface temperature.

In an embodiment of the disclosure, when performing the plurality of test modes, the testing equipment transmits at least one instruction to the memory storage device, and the memory storage device receives and executes the at least one instruction.

In an embodiment of the disclosure, the at least one instruction includes at least one of a write instruction and a read instruction.

In an embodiment of the disclosure, the multiple test modes include a test environment temperature. The testing equipment performs tests on the memory storage device at the test environment temperature.

In an embodiment of the disclosure, the memory control circuit unit includes a thermal sensor, and the thermal sensor is configured to measure the first internal temperature or the first current internal temperature of the memory control circuit unit.

In an embodiment of the disclosure, the memory package includes a thermal sensor, and the thermal sensor is configured to measure the second internal temperature or the second current internal temperature of the memory package.

In an embodiment of the disclosure, the testing equipment includes a thermal sensor configured to measure the surface temperature of the memory package.

In an embodiment of the disclosure, the operation of performing, by the testing equipment, a plurality of test modes on the memory storage device includes: determining whether the surface temperature is greater than a first temperature threshold, and when the surface temperature is greater than the first temperature threshold, the operating frequency for accessing the rewritable non-volatile memory module is reduced.

In an embodiment of the disclosure, the memory storage device calculates multiple predicted surface temperatures of the plurality of memory packages by using the linear relationship expression corresponding to each of the memory packages, and selects a maximum value of the multiple predicted surface temperatures of the multiple memory packages as the predicted surface temperature of the rewritable non-volatile memory module.

In an embodiment of the disclosure, the operation of adjusting, by the memory storage device, an operating frequency for accessing the rewritable non-volatile memory module based on the predicted surface temperature includes: determining whether to adjust the operating frequency for accessing the rewritable non-volatile memory module according to the preset temperature threshold.

In an embodiment of the disclosure, the operation of determining whether to adjust the operating frequency for accessing the rewritable non-volatile memory module according to the preset temperature threshold includes: if it is determined that the predicted surface temperature is greater than the second temperature threshold, the operating frequency for accessing the rewritable non-volatile memory module is reduced by the memory storage device.

Based on the above, the memory temperature controlling method and the memory temperature controlling system provided by the embodiments of the disclosure can establish the relationship expression of the internal temperature of the memory control circuit unit, the internal temperature of the memory package, and the surface temperature of the memory package. By using the established relationship expression, in the operating stage, the memory storage device predicts the current surface temperature of the memory package according to the current internal temperature of the memory control circuit unit and the current internal temperature of each of the memory packages. In this manner, the memory storage device can predict the surface temperature of the rewritable non-volatile memory module, and adjust the operating frequency for accessing the rewritable non-volatile memory module according to the predicted surface temperature, thereby using temperature control and frequency modulation to protect the memory storage device. In addition, the embodiment of the disclosure can also reduce the configuration of thermal sensors for measuring the surface temperature of the rewritable non-volatile memory module, thereby reducing costs of production.

DESCRIPTION OF THE EMBODIMENTS

Generally speaking, a memory storage device (also known as a memory storage system) includes a rewritable non-volatile memory module and a controller (also known as a control circuit unit). Generally, the memory storage device is used together with the host system, so that the host system can write data to the memory storage device or read data from the memory storage device.

Figure 1:
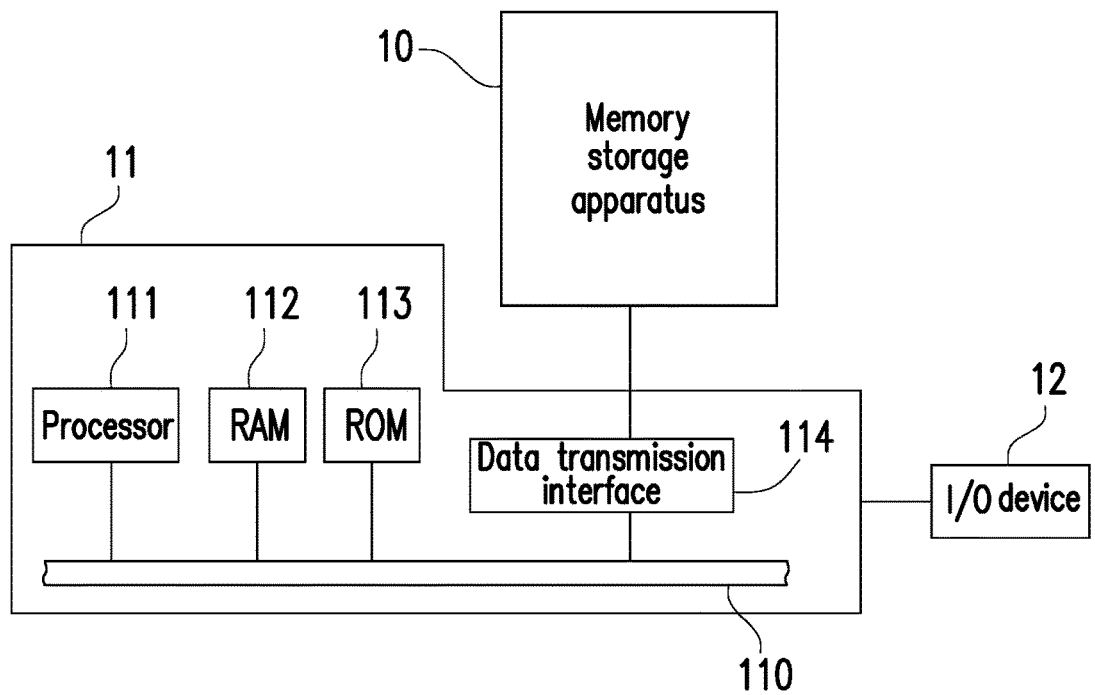
FIG. 1 is a schematic diagram of a host system, a memory storage device, and an input/output (I/O) device according to an exemplary embodiment.
Figure 2:
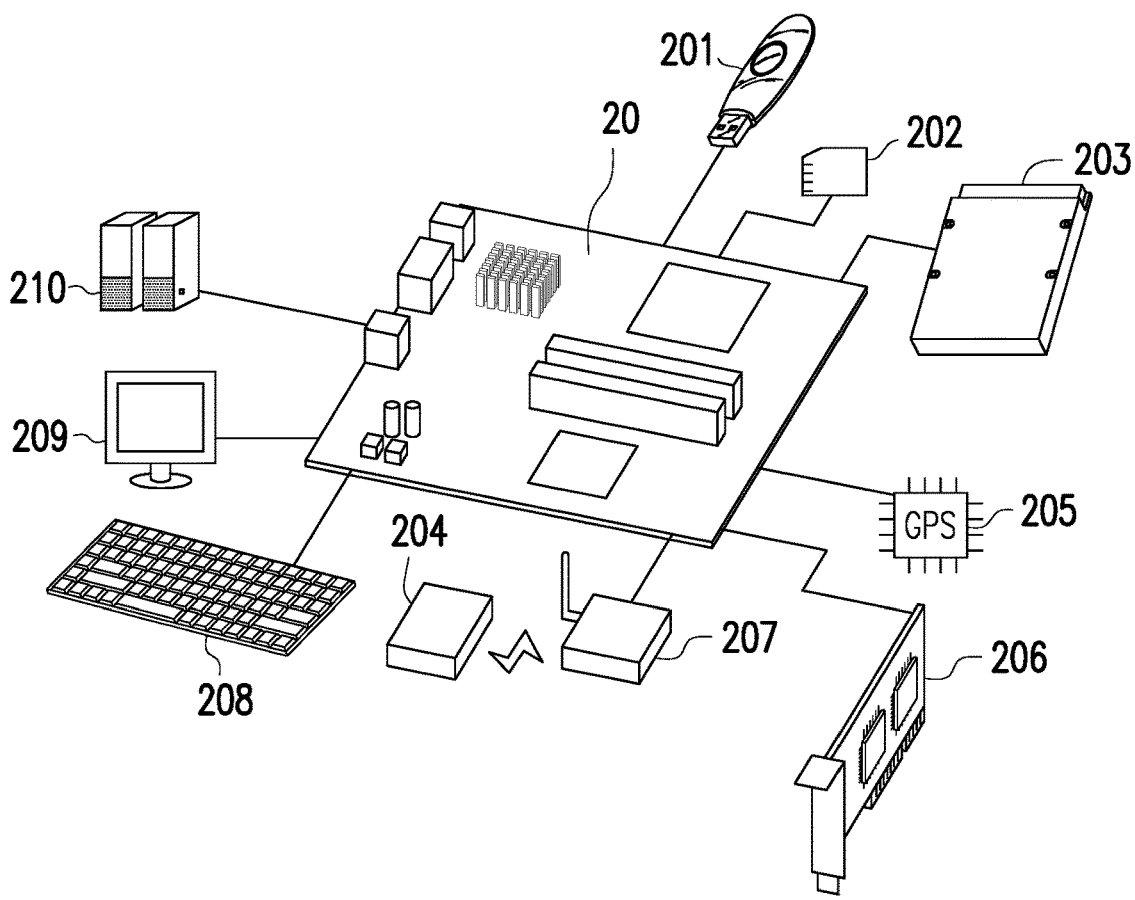
FIG. 2 is a schematic diagram of a host system, a memory storage device, and an input/output (I/O) device according to another exemplary embodiment.

FIG. 1 is a schematic diagram of a host system, a memory storage device, and an input/output (I/O) device according to an exemplary embodiment. FIG. 2 is a schematic diagram of a host system, a memory storage device, and an input/output (I/O) device according to another exemplary embodiment.

Please refer to FIG. 1 and FIG. 2, the host system 11 generally includes a processor 111, a RAM (random access memory) 112, a ROM (read only memory) 113 and a data transmission interface 114. The processor 111, the random access memory 112, the read-only memory 113, and the data transmission interface 114 are all coupled to a system bus 110.

In this exemplary embodiment, the host system 11 is coupled to the memory storage device 10 through the data transmission interface 114. For example, the host system 11 can write data to the memory storage device 10 or read data from the memory storage device 10 through the data transmission interface 114. In addition, the host system 11 is coupled to the I/O device 12 through the system bus 110. For example, the host system 11 can transmit output signals to the I/O device 12 or receive input signals from the I/O device 12 through the system bus 110.

In this exemplary embodiment, the processor 111, the random access memory 112, the read-only memory 113, and the data transmission interface 114 may be disposed on the motherboard 20 of the host system 11. The number of data transmission interfaces 114 may be one or more. Through the data transmission interface 114, the motherboard 20 can be coupled to the memory storage device 10 in a wired or wireless manner. The memory storage device 10 may be, for example, a flash drive 201, a memory card 202, a SSD (solid state drive) 203, or a wireless memory storage device 204. The wireless memory storage device 204 may be, for example, a memory storage device based on various wireless communication technologies, such as a NFC (Near Field Communication Storage) memory storage device, a WiFi (Wireless Fidelity) memory storage device, a Bluetooth memory storage device, or a BLE (Bluetooth low energy) memory storage device (e.g., iBeacon). Further, the motherboard 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the motherboard 20 can access the wireless memory storage device 204 through the wireless transmission device 207.

Figure 3:
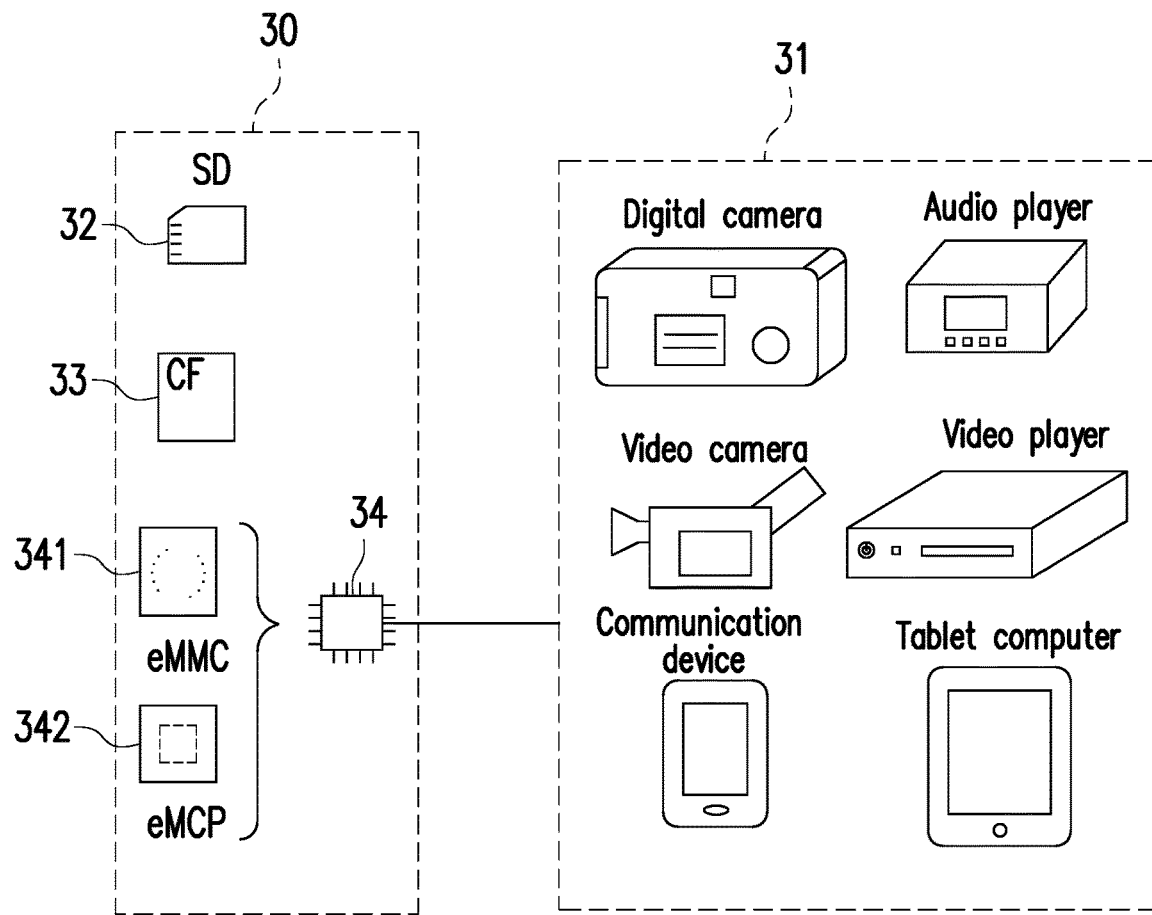
FIG. 3 is a schematic diagram of a host system and a memory storage device according to still another exemplary embodiment.

In an exemplary embodiment, aforementioned host system may be any system capable of substantially cooperating with the memory storage device for storing data. Although the host system is illustrated as a computer system in foregoing exemplary embodiment, FIG. 3 is a schematic diagram illustrating a host system and a memory storage device according to another exemplary embodiment. Referring to FIG. 3, in another exemplary embodiment, a host system 31 may also be a system including a digital camera, a video camera, a communication device, an audio player, a video player or a tablet computer, whereas a memory storage device 30 may be various non-volatile memory storage devices used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
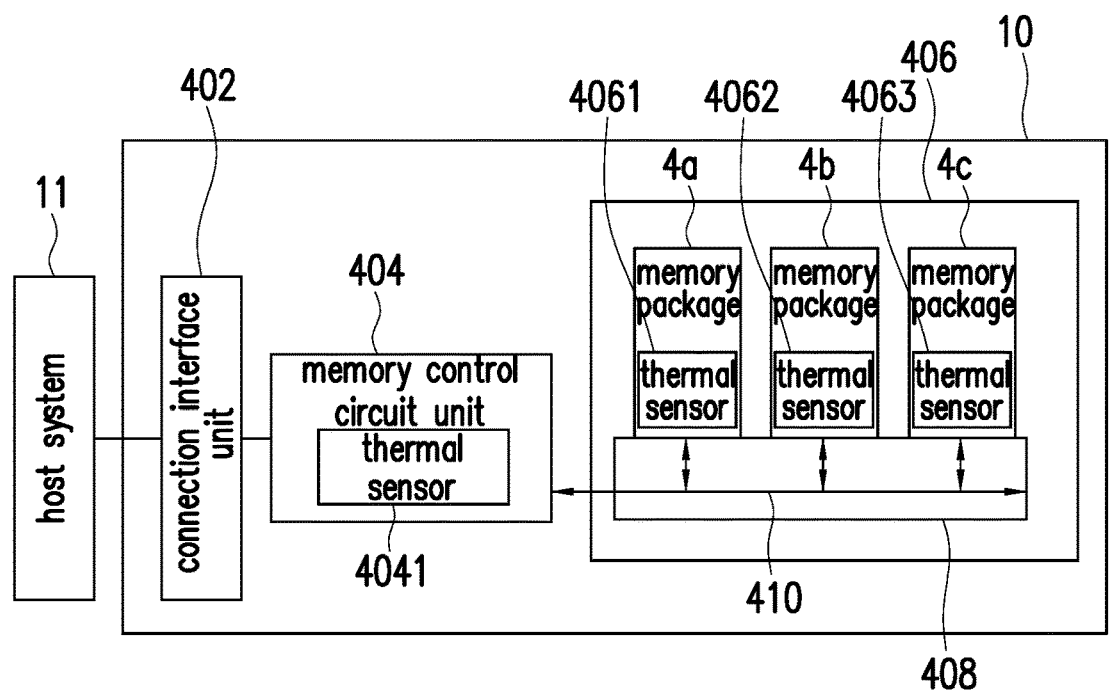
FIG. 4 is a schematic block diagram of a host system and a memory storage device according to an exemplary embodiment of the disclosure.

FIG. 4 is a schematic block diagram illustrating a host system and a memory storage device according to an exemplary embodiment.

Referring to FIG. 4, the memory storage device 10 includes a connection interface unit 402, a memory control circuit unit 404 and a rewritable non-volatile memory module 406.

In the exemplary embodiment, the connection interface unit 402 is compatible with a SATA (Serial Advanced Technology Attachment) standard. Nevertheless, it should be understood that the disclosure is not limited thereto. The connection interface unit 402 may also be compatible with a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD (Secure Digital) interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. The connection interface unit 402 and the memory control circuit unit 404 may be packaged into one chip, or the connection interface unit 402 is distributed outside of a chip containing the memory control circuit unit 404.

The memory control circuit unit 404 is connected to the host system 11 through the connection interface unit 402, and is connected to and drives and controls various memory packages 4a to 4c through the bus 410. The memory control circuit unit 404 is configured to perform multiple logic gates or control instructions implemented in the form of hardware or firmware, and perform data writing, data reading, and data reading in various memory packages 4a to 4c according to the instructions of the host system 11. The memory control circuit unit 404 may include a memory management circuit (not shown), a host interface (not shown), and a memory interface (not shown). The memory management circuit is configured to control the overall operation of the memory control circuit unit 404. Specifically, the memory management circuit has multiple control instructions. Moreover, when the memory storage device 10 is operating, the control instructions of the memory management circuit are implemented in the form of firmware, code or hardware, and these control instructions are executed to perform operations such as writing, reading, and erasing data. The following description of the operation of the memory control circuit unit 404 is equivalent to the description of the operation of the memory storage device 10.

In this exemplary embodiment, the memory control circuit unit 404 includes a thermal sensor 4041. The thermal sensor 4041 may include, for example, a thermistor built in the memory control circuit unit 404 to measure the temperature of the memory control circuit unit 404 (for example, the internal temperature $T_j$). The thermistor may include a resistor whose resistance value changes with temperature, and the volume changes with temperature at a more considerable level than that of general fixed-value resistors.

The rewritable non-volatile memory module 406 includes a plurality of memory packages 4a to 4c mounted on a PCB substrate 408. However, the memory packages 4a to 4c in FIG. 4 are one of the implementations of the disclosure, and the disclosure provides no limitation to the number of memory packages included in the memory storage device 10. One or more memory chips are built in the memory packages 4a to 4c, and are configured to store data written by the host system 11. The memory chip has an interface chip and a memory cell array, such as a NAND flash memory chip. The multiple memory cells included in the memory cell array can be SLC (Single Level Cell) memory cell (i.e., one memory cell capable of storing one bit), a MLC (Multi Level Cell) memory cell (i.e., one memory cell capable of storing two bits), a TLC (Triple Level Cell) memory cell (i.e., one memory cell capable of storing three bits), or other types of memory cells.

In this exemplary embodiment, the memory packages 4a to 4c include thermal sensors 4061 to 4063, respectively. The thermal sensors 4061 to 4063 may include, for example, thermistors built in various memory packages 4a to 4c to measure the temperature of various memory packages 4a to 4c (for example, the internal temperature $T_j$).

Figure 5:
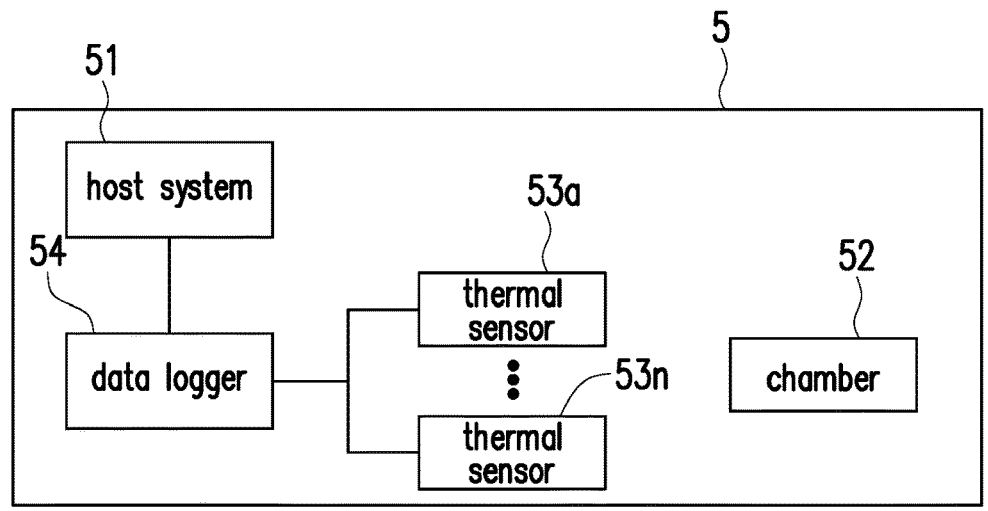
FIG. 5 is a schematic diagram of a testing equipment of a memory storage device according to an exemplary embodiment of the disclosure.

FIG. 5 is a schematic diagram of a testing equipment of a memory storage device according to an exemplary embodiment of the disclosure. Please refer to FIG. 5, the testing equipment 5 includes a host system 51, a chamber 52, a thermal sensor, and a data logger 54. The thermal sensor may include, for example, a plurality of thermal sensors 53a to 53n as shown in FIG. 5. The host system 51 can configure a standard I/O performance evaluation tool (for example, IOMeter) to perform various test modes on the memory storage device 10 and obtain data from test result. The chamber 52 is configured to carry the memory storage device 10 and can realize a constant temperature environment. The chamber 52 is, for example, a device that can be operated independently, or a device that is coupled to the host system 51 and can be operated through the host system 51. The thermal sensors 53a to 53n are, for example, J-type thermocouple probes, infrared detectors arranged above the memory package, or other sensors that can measure the temperature of the memory package (for example, the surface temperature $T_a$). The disclosure is not limited thereto.

The data recorder 54 includes, but is not limited to, a connection interface unit, a microprocessor, and a memory for data storage, and can be coupled to the thermal sensors 53a to 53n to record temperature data that changes over time through the thermal sensors 53a to 53n. In this exemplary embodiment, the data logger 54 is connected to the host system 51 through a connection interface unit, which conforms to the universal serial bus standard, but the disclosure is not limited thereto. After the data logger 54 is connected to the host system 51, the host system 51 can execute specific software to activate the data logger 54 and receive data from the data logger 54 to view and analyze the data collected by the data logger 54 from the thermal sensors 53a to 53n.

Figure 6:
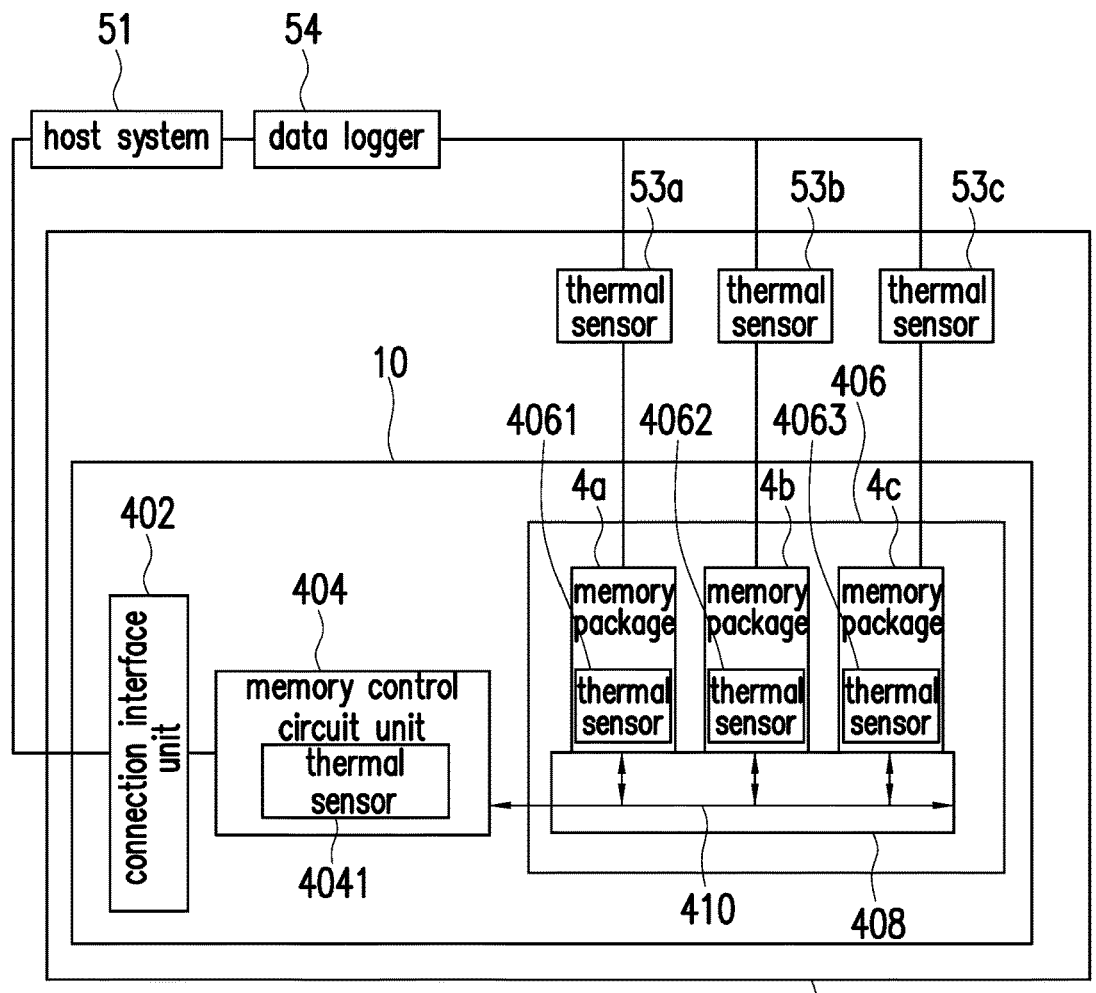
FIG. 6 is a schematic diagram of testing a memory storage device according to an exemplary embodiment of the disclosure.

FIG. 6 is a schematic diagram of testing a memory storage device according to an exemplary embodiment of the disclosure. In the exemplary embodiment of FIG. 6, it is assumed that the J-type thermocouple probe is used to measure the surface temperature $T_c$ of the memory package, and it is assumed that the memory storage device 10 includes memory packages 4a to 4c. Please refer to FIG. 6, the memory storage device 10 can be placed in the chamber 52. The host system 51 is coupled to the connection interface unit 402 to perform data transmission with the memory control circuit unit 404. For example, the memory storage device 10 to which the initial firmware is initially written can be placed on a PCIe interface adapter board, and a PCIe slot connected to the host system 51 can be drawn from the chamber 52 through a PCIe extension cable. The connection can also adopt other interface standards, and the disclosure is not limited thereto.

In this exemplary embodiment, the thermal sensors 53a to 53c can be respectively fixed on the surfaces of the memory packages 4a to 4c, and the other end is coupled to the data logger 54 and configured to sense the surface temperature $T_c$ of the memory packages 4a to 4c. In another exemplary embodiment, a thermal sensor (not shown) suspended above the rewritable non-volatile memory module 406 may be provided, for example, a J-type thermocouple probe. This thermal sensor is configured to measure the temperature around the rewritable non-volatile memory module 406 (for example, the ambient temperature $T_a$). The suspended thermal sensor can be provided to determine whether the thermal sensors 53a to 53c have measurement errors.

In an exemplary embodiment, the host system 51 stores a plurality of test modes. The test mode includes at least one instruction, and the instruction may include writing instruction or reading instruction. In the testing stage, the memory storage device 10 to which the firmware is initially written is placed in the chamber 52. The host system 51 transmits at least one instruction to the memory storage device 10 when performing the test mode. The memory storage device 10 receives and executes instructions from the host system 51, and executes the instructions in a sequential read/write or random read/write mode. For example, the host system 51 can use a standard I/O performance evaluation tool to perform tests such as 128 KB sequential write on the memory storage device 10.

In an exemplary embodiment, the test mode may further include a test environment temperature. Specifically, when the test mode is performed, the chamber 52 can be used to realize a constant temperature environment corresponding to multiple test environment temperatures, and at least one instruction is transmitted to the memory storage device 10 under the test environment temperature to perform a test on the memory storage device 10.

Table 1 below is an exemplary embodiment of the test mode.

TABLE 1

|  | instruction | test environment temperatures |
| --- | --- | --- |
| Test mode 1 | sequential write | 25° C. |
| Test mode 2 | sequential read | 25° C. |
| Test mode 3 | sequential write | 26° C. |
| Test mode 4 | sequential read | 26° C. |
| . . . | . . . | . . . |
| Test mode N-1 | sequential write | 70° C. |
| Test mode N | sequential read | 70° C. |

Please refer to Table 1 above. In this exemplary embodiment, the chamber 52 is provided to achieve a constant temperature environment corresponding to the test environment temperature of 25° C. to 70° C., and a standard I/O performance evaluation tool is used to perform sequential write, sequential read/write and the like on the memory storage device 10 in a constant temperature environment. Specifically, this exemplary embodiment implements the following procedures on the standard I/O performance evaluation tool executed by the chamber 52 and the host system 51 to perform various test modes. Step 1: The chamber 52 makes the test environment temperature reach 25° C. within 5 minutes. Step 2: The test mode 1 is performed to perform sequential write for 5 minutes at a test environment temperature of 25° C. Step 3: The test mode 2 is performed to perform sequential read for 5 minutes at a test environment temperature of 25° C. Step 4: The host system 51 idles the memory storage device 10 for 10 minutes, and the chamber 52 simultaneously increases the test environment temperature by 1° C. to 26° C. Step 5: Repeat the above steps 1 to 4 until the temperature of the chamber 52 reaches 70° C. and the test is completed. Step 6: End the test. However, the disclosure provides no limitation to the flow sequence of the test modes, and the user can adjust parameters such as the range of the test environment temperature, the execution time and the idle time of the test mode according to requirements.

While performing the test mode, the host system 51 will receive and record various data, such as read and write performance and temperature data. The host system 51 records such data at a frequency of once per second, for example, and the disclosure is not limited thereto. For example, the host system 51 receives and records the internal temperature (also referred to as the first internal temperature) of the memory control circuit unit 404 measured by the thermal sensor 4041 and the internal temperature (also called the second internal temperature) of the memory packages 4a to 4c measured by the thermal sensors 4061 to 4063. For example, the host system 51 records the first internal temperature and the second internal temperature at a frequency of once per second, and the disclosure is not limited thereto. In this exemplary embodiment, the host system 51 can also receive and record the surface temperatures of the memory packages 4a to 4c measured by the thermal sensors 53a to 53c. These surface temperatures are acquired by the data logger 54 and sent to the host system 51. The frequency of collecting the temperature by the data logger 54 is, for example, once per second, and the disclosure is not limited thereto. Table 2 below is an example of the test results recorded after the host system 51 performs the test mode.

TABLE 2

| Test mode | Internal temperature of the memory control circuit unit | Memory package | Internal temperature of the memory package | Surface temperature of memory package |
| --- | --- | --- | --- | --- |
| 1 | $T_{j11}$ | 4a | $T_{j21}$ | $T_{c1}$ |
|  |  | 4b | $T_{j22}$ | $T_{c2}$ |
|  |  | 4c | $T_{j23}$ | $T_{c3}$ |
| 2 | $T_{j12}$ | 4a | $T_{j24}$ | $T_{c4}$ |
|  |  | 4b | $T_{j25}$ | $T_{c5}$ |
|  |  | 4c | $T_{j26}$ | $T_{c6}$ |

Please refer to Table 2 above. When the host system 51 performs the test mode 1, the first internal temperature of the memory control circuit unit 404 received by the host system 51 is $T_{j11}$, and the received second internal temperatures of the memory packages 4a to 4c are $T_{j21}$ to $T_{j23}$, and the surface temperatures are $T_{c1}$ to $T_{c3}$. Generally speaking, since the operations performed by various memory packages may be different, and the location distributions are also different, the surface temperatures and internal temperatures of various memory packages may be different. For example, the temperature of the memory control circuit unit 404 may affect the surface temperature and internal temperature of the memory package. In addition, in this exemplary embodiment, the data that is received when the host system 51 performs the test mode 2 can be derived from Table 2 above, so no further description is incorporated herein.

In an exemplary embodiment, the temperature threshold can be set when the test mode is performed to prevent the rewritable non-volatile memory module 406 from being damaged due to high temperature during the test. Specifically, the memory control circuit unit 404 can determine whether the surface temperature of the memory package is greater than a preset temperature threshold (also referred to as a first temperature threshold), and reduce the operating frequency for accessing the rewritable non-volatile memory module 406 when the surface temperature is greater than the first temperature threshold, so as to prevent the temperature from continuing to rise sharply. For example, the first temperature threshold can be set to 68° C. The first temperature threshold will be lower than the recommended operating temperature of the rewritable non-volatile memory module 406, for example, 70° C.

Figure 7:
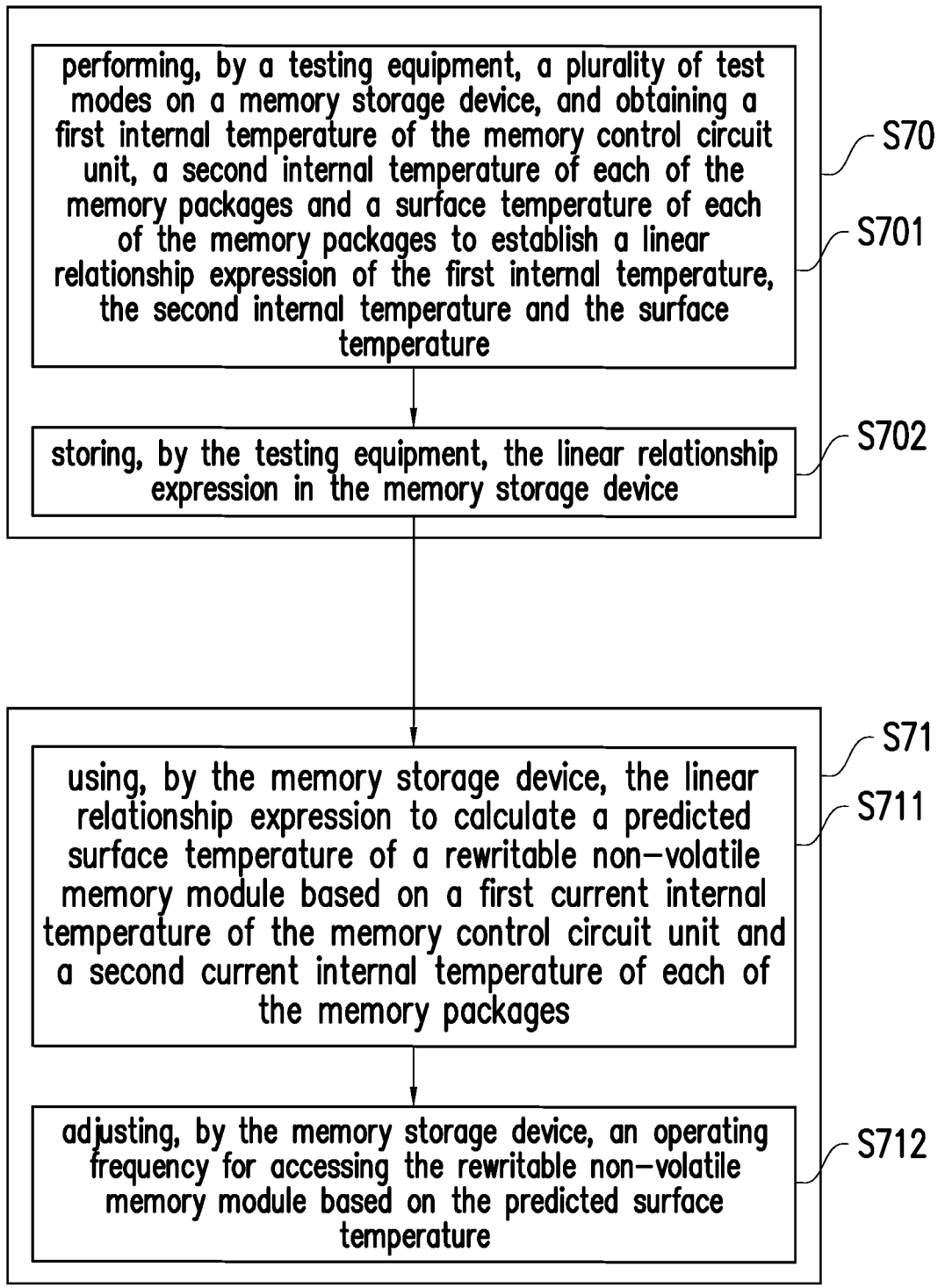
FIG. 7 is a flowchart of a memory temperature controlling method according to an exemplary embodiment of the disclosure.

FIG. 7 is a flowchart of a memory temperature controlling method according to an exemplary embodiment of the disclosure. Please refer to FIG. 6 and FIG. 7 both. The method of this embodiment is applicable to the above-mentioned testing equipment 5 and the memory storage device 10, the following is the detailed steps of the memory temperature controlling method in the embodiment with reference to various devices and components of the testing equipment 5 and the memory storage device 10.

Here, the testing stage S70 includes steps S701 and S702, and the operating stage S71 includes steps S711 and S712.

In step S701, multiple test modes are performed on the memory storage device 10 through the testing equipment 5, and the first internal temperature of the memory control circuit unit 404, the second internal temperature of each of the memory packages, and the surface temperature of each of the memory packages are obtained to establish a linear relationship expression of the first internal temperature, the second internal temperature and the surface temperature. Specifically, the host system 51 may use the first internal temperature of the memory control circuit unit 404 and the second internal temperature of the memory package obtained in the testing stage as independent variables, and set the surface temperature of the memory package as a dependent variable to perform multiple linear regression analysis. Based on the analysis result, the host system 51 can fit the linear relationship expression of the first internal temperature, the second internal temperature and the surface temperature of each of the memory packages. In an exemplary embodiment, the host system 51 may use the SPSS (Statistical Product and Service Solutions) provided by IBM to perform multiple linear regression analysis. Here, the relationship between the first internal temperature, the second internal temperature, and the surface temperature can be more accurately estimated through the relationship expression fitted by the multiple linear regression analysis, so that the subsequent temperature prediction results are more accurate.

In this exemplary embodiment, the linear relationship expression established by the host system 51 is shown in the following equation (1):

$$T_c[PK] = a \times T_{j1} + b \times T_{j2}[PK] + c \qquad (1)$$

In the equation, PK represents the serial number of the memory package, such as 4a to 4c in FIG. 6. $T_c[PK]$ represents the surface temperature of the memory package PK. a and b are coefficients, and c is a constant. $T_{j1}$ represents the internal temperature of the memory control circuit unit 404. $T_{j2}$ [PK] represents the internal temperature of the memory package PK.

The above Table 2 is taken as an example. When a linear relationship expression associated with the memory package 4a is to be established, the host system 51 can perform a multiple linear regression analysis based on the received first internal temperatures $T_{j11}$ and $T_{j12}$, the second internal temperatures $T_{j21}$ and $T_{j24}$, and the surface temperatures $T_{c1}$ and $T_{c4}$ to establish the linear relationship expression of the first internal temperature, the second internal temperature and the surface temperature of the memory package 4a. In this exemplary embodiment, the linear relationship expression established for the memory package 4a by the host system 51 is as shown in the following equation (2):

$$T_c[4a]=a\times T_{j1}+b\times T_{j2}[4a]+c \qquad (2)$$

In the equation, $T_c[4a]$ represents the surface temperature of the memory package 4a. a and b are coefficients, and c is a constant. $T_{j1}$ represents the internal temperature of the memory control circuit unit 404. $T_{j2}$ [4a] represents the internal temperature of the memory package 4a. The linear relational expressions of other memory packages 4b to 4c and the linear relational expressions of the memory package 4a are obtained by fitting in the same manner, and no further description is incorporated herein. In other words, the embodiment of the disclosure can establish a linear relationship expression corresponding to various memory packages.

In step S702, the linear relationship expression is stored in the memory storage device 10 through the testing equipment 5. After establishing the linear relationship expression of various memory packages, the host system 51 stores the established linear relationship expressions in the memory storage device 10.

In step S711, the memory storage device 10 (memory control circuit unit 404) uses a linear relationship expression to calculate the predicted surface temperature of rewritable non-volatile memory module 406 based on the first current internal temperature of the memory control circuit unit 404 and the second current internal temperature of each of the memory packages. Specifically, the memory storage device 10 can be used together with the host system 11 shown in FIG. 1 and FIG. 4 (which may be different from the host system 51 of the testing equipment 5) during actual operation. When the memory storage device 10 is operating, the thermal sensor 4041 measures the first current internal temperature of the memory control circuit unit 404, and the thermal sensors 4061 to 4063 measure the second current internal temperature of the memory packages 4a to 4c. In an exemplary embodiment, the memory control circuit unit 404 reads the first current internal temperature and the second current internal temperature at a frequency of, for example, once per second, and the disclosure is not limited thereto.

In this exemplary embodiment, the number of memory packages included in the rewritable non-volatile memory module 406 may be multiple. The memory storage device 10 can calculate a plurality of predicted surface temperatures corresponding to each of the memory packages according to the linear relationship expression corresponding to each of the memory packages, the first current internal temperature, and the second current internal temperature of the memory package.

For example, if the memory control circuit unit 404 is to predict the predicted surface temperature of the first memory package (assumed to be the memory package 4a), the memory control circuit unit 404 will use the linear relationship expression associated with the memory package 4a and calculate the predicted surface temperature of the memory package 4a based on the first current internal temperature of the memory control circuit unit 404 and the second current internal temperature of the memory package 4a. In other words, the memory storage device 10 of this exemplary embodiment does not include a thermal sensor that can measure the surface temperature of the memory packages 4a to 4c. Therefore, the surface temperature of each of the memory packages 4a to 4c can be predicted according to the corresponding linear relationship expression, the first current internal temperature, and the second current internal temperature. In this way, the memory storage device 10 does not need to be provided with a thermal sensor for measuring the surface temperature of the memory package to predict the surface temperature of each of the memory packages, thereby saving the circuit layout space of the PCB substrate.

In an exemplary embodiment, the memory control circuit unit 404 can calculate the predicted surface temperature of any memory package as the predicted surface temperature of the rewritable non-volatile memory module 406. In another exemplary embodiment, the memory control circuit unit 404 may calculate the predicted surface temperature of a plurality of memory packages, and select the maximum value among the predicted surface temperatures as the predicted surface temperature of the rewritable non-volatile memory module 406.

In step S712, the memory storage device 10 (memory control circuit unit 404) adjusts the operating frequency (i.e., operating speed) for accessing (i.e., read and write) the rewritable non-volatile memory module 406 based on the predicted surface temperature. Here, the memory control circuit unit 404 will reduce the operating frequency for accessing the rewritable non-volatile memory module 406 when the predicted surface temperature of the rewritable non-volatile memory module 406 is too high.

For example, the memory control circuit unit 404 may determine whether to adjust the operating frequency for accessing the rewritable non-volatile memory module 406 according to a preset temperature threshold. In an exemplary embodiment, the memory control circuit unit 404 can determine whether the predicted surface temperature is greater than the temperature threshold (also referred to as the second temperature threshold, for example, 68° C.). If it is determined that the predicted surface temperature is greater than the second temperature threshold, the memory control circuit unit 404 will reduce the operating frequency for accessing the rewritable non-volatile memory module 406. For example, the memory control circuit unit 404 can reduce the first operating frequency for accessing the rewritable non-volatile memory module 406 to a second operating frequency, and the second operating frequency is lower than the first operating frequency.

In another exemplary embodiment, the user can set more temperature thresholds and corresponding operating frequencies as the conditions for judging and adjusting the operating frequency according to requirements, and the disclosure is not limited thereto. For example, the memory control circuit unit 404 can determine whether the predicted surface temperature is greater than the second temperature threshold (for example, 68° C.) or another temperature threshold (also referred to as the third temperature threshold, for example, 70° C.). If it is determined that the predicted surface temperature is greater than the second temperature threshold, the memory control circuit unit 404 will reduce the operating frequency for accessing the rewritable non-volatile memory module 406. For example, the memory control circuit unit 404 can reduce the first operating frequency for accessing the rewritable non-volatile memory module 406 to a second operating frequency, and the second operating frequency is lower than the first operating frequency. In addition, if it is determined that the predicted surface temperature is greater than the third temperature threshold, the memory control circuit unit 404 will access the rewritable non-volatile memory module 406 at a lower operating frequency. For example, the memory control circuit unit 404 can reduce the first operating frequency (or the second operating frequency) for accessing the rewritable non-volatile memory module 406 to a third operating frequency, and the third operating frequency is lower than the first operating frequency and the second operating frequency.

In summary, the memory temperature controlling method and the memory temperature controlling system provided by the embodiments of the disclosure can establish a relationship expression of the internal temperature of the memory control circuit unit, the internal temperature of the memory package, and the surface temperature of the memory package. By using the established relationship expression, in the operating stage, the memory storage device predicts the current surface temperature of the memory package according to the current internal temperature of the memory control circuit unit and the current internal temperature of each of the memory packages. In this manner, the memory storage device can predict the surface temperature of a single memory package, and therefore is able to take the surface temperature of each of the memory packages into account when determining whether to adjust the operating frequency for accessing the rewritable non-volatile memory module, thereby ensuring the reliability of temperature prediction.

Moreover, in the embodiment of the disclosure, when predicting the surface temperature, taking both of the current internal temperature of the memory control circuit unit and the current internal temperature of the memory package into consideration can also make the prediction result more accurate. In addition, the memory storage device of this embodiment does not need to be provided with a thermal sensor for measuring the rewritable non-volatile memory module to predict the surface temperature of the rewritable non-volatile memory module, thereby optimizing the circuit layout space of the PCB substrate and saving costs for components.

What is claimed is:

1. A memory temperature controlling method, adapted for a memory storage device, the memory storage device comprising a memory control circuit unit and a rewritable non-volatile memory module, the rewritable non-volatile memory module comprising a plurality of memory packages, and the method comprising:
performing, by a testing equipment, a plurality of test modes on the memory storage device, and obtaining a first internal temperature of the memory control circuit unit, a second internal temperature of each of the memory packages and a surface temperature of each of the memory packages to establish a linear relationship expression of the first internal temperature, the second internal temperature and the surface temperature;
storing, by the testing equipment, the linear relationship expression in the memory storage device;
using, by the memory storage device, the linear relationship expression to calculate a predicted surface temperature of the rewritable non-volatile memory module based on a first current internal temperature of the memory control circuit unit and a second current internal temperature of each of the memory packages; and
adjusting, by the memory storage device, an operating frequency for accessing the rewritable non-volatile memory module based on the predicted surface temperature.

2. The memory temperature controlling method according to claim 1, wherein when performing the plurality of test modes, the testing equipment transmits at least one instruction to the memory storage device, and the memory storage device receives and executes the at least one instruction.

3. The memory temperature controlling method according to claim 2, wherein the at least one instruction comprises at least one of a write instruction and a read instruction.

4. The memory temperature controlling method according to claim 1, wherein the plurality of test modes comprise a test environment temperature, and the method further comprises:
testing, by the testing equipment, the memory storage device at the test environment temperature.

5. The memory temperature controlling method according to claim 1, wherein the step of performing, by the testing equipment, the plurality of test modes on the memory storage device comprises:
determining whether the surface temperature is greater than a first temperature threshold, and when the surface temperature is greater than the first temperature threshold, the operating frequency for accessing the rewritable non-volatile memory module is reduced.

6. The memory temperature controlling method according to claim 1, wherein the method further comprises:
calculating, by the memory storage device, a plurality of predicted surface temperatures of the plurality of memory packages by using the linear relationship expression corresponding to each of the memory packages, and selecting a maximum value of the plurality of predicted surface temperatures of the plurality of memory packages as the predicted surface temperature of the rewritable non-volatile memory module.

7. The memory temperature controlling method according to claim 1, wherein the step of adjusting, by the memory storage device, the operating frequency for accessing the rewritable non-volatile memory module based on the predicted surface temperature comprises:
determining whether to adjust the operating frequency for accessing the rewritable non-volatile memory module according to a preset temperature threshold.

8. The memory temperature controlling method according to claim 7, wherein the step of determining whether to adjust the operating frequency for accessing the rewritable non-volatile memory module according to the preset temperature threshold comprises:
if it is determined that the predicted surface temperature is greater than a second temperature threshold, the operating frequency for accessing the rewritable non-volatile memory module is reduced by the memory storage device.

9. A memory temperature controlling system, comprising:
a testing equipment; and
a memory storage device, comprising a memory control circuit unit and a rewritable non-volatile memory module, wherein the rewritable non-volatile memory module comprises a plurality of memory packages, wherein
the testing equipment performs a plurality of test modes on the memory storage device, and obtains a first internal temperature of the memory control circuit unit, a second internal temperature of each of the memory packages, and a surface temperature of each of the memory packages to establish a linear relationship expression of the first internal temperature, the second internal temperature and the surface temperature;

the testing equipment stores the linear relationship expression in the memory storage device;

the memory storage device uses the linear relationship expression to calculate a predicted surface temperature of the rewritable non-volatile memory module based on a first current internal temperature of the memory control circuit unit and a second current internal temperature of each of the memory packages; and the memory storage device adjusts an operating frequency for accessing the rewritable non-volatile memory module based on the predicted surface temperature.

10. The memory temperature controlling system according to claim 9, wherein when performing the plurality of test modes, the testing equipment transmits at least one instruction to the memory storage device, and the memory storage device receives and executes the at least one instruction.

11. The memory temperature controlling system according to claim 10, wherein the at least one instruction comprises at least one of a write instruction and a read instruction.

12. The memory temperature controlling system according to claim 9, wherein the plurality of test modes comprise a test environment temperature, and the testing equipment performs tests on the memory storage device at the test environment temperature.

13. The memory temperature controlling system according to claim 9, wherein the memory control circuit unit comprises a thermal sensor, and the thermal sensor is configured to measure the first internal temperature or the first current internal temperature of the memory control circuit unit.

14. The memory temperature controlling system according to claim 9, wherein the memory package comprises a thermal sensor, and the thermal sensor is configured to measure the second internal temperature or the second current internal temperature of the memory package.

15. The memory temperature controlling system according to claim 9, wherein the testing equipment comprises a thermal sensor configured to measure the surface temperature of the memory package.

16. The memory temperature controlling system according to claim 9, wherein the operation of performing, by the testing equipment, the plurality of test modes on the memory storage device comprises:

determining whether the surface temperature is greater than a first temperature threshold, and when the surface temperature is greater than the first temperature threshold, the operating frequency for accessing the rewritable non-volatile memory module is reduced.

17. The memory temperature controlling system according to claim 9, wherein the memory storage device calculates a plurality of predicted surface temperatures of the plurality of memory packages by using the linear relationship expression corresponding to each of the memory packages, and selects a maximum value of the plurality of predicted surface temperatures of the plurality of memory packages as the predicted surface temperature of the rewritable non-volatile memory module.

18. The memory temperature controlling system according to claim 9, wherein the operation of adjusting, by the memory storage device, the operating frequency for accessing the rewritable non-volatile memory module based on the predicted surface temperature comprises:

determining whether to adjust the operating frequency for accessing the rewritable non-volatile memory module according to a preset temperature threshold.

19. The memory temperature controlling system according to claim 18, wherein the operation of determining whether to adjust the operating frequency for accessing the rewritable non-volatile memory module according to the preset temperature threshold comprises:

if it is determined that the predicted surface temperature is greater than a second temperature threshold, the operating frequency for accessing the rewritable non-volatile memory module is reduced by the memory storage device.

* * * * *